(12) United States Patent
Guccione et al.

(10) Patent No.: US 6,668,237 B1
(45) Date of Patent: Dec. 23, 2003

(54) RUN-TIME RECONFIGURABLE TESTING OF PROGRAMMABLE LOGIC DEVICES

(75) Inventors: Steven A. Guccione, Austin, TX (US); Prasanna Sundararajan, Campbell, CA (US); Scott P. McMillan, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 157 days.

(21) Appl. No.: 10/052,720

(22) Filed: Jan. 17, 2002

(51) Int. Cl.[7] .............................. G01R 27/28; G06F 7/38
(52) U.S. Cl. .............................. 702/119; 716/4; 326/38; 326/39; 326/41; 714/725; 714/727
(58) Field of Search .............................. 702/119; 716/4, 716/16, 17; 326/16, 38, 39, 40, 41; 714/725, 727

(56) References Cited

U.S. PATENT DOCUMENTS 6,453,456 B1 * 9/2002 Price ........................... 716/16

OTHER PUBLICATIONS

Prasanna Sundararajan, Scott McMillan and Steven A. Guccione, Entitled: "Testing FPGA Devices Using JBits", available from Xilinx, Inc., 2100 Logic Drive, San Jose, CA 95124, Dated: Sep. 11–13, 2001, MAPLD 2001. pp. 1–8.

* cited by examiner

Primary Examiner—John Barlow
Assistant Examiner—Meagan S. Walling
(74) Attorney, Agent, or Firm—LeRoy D. Maunu; Edel M. Young; Justin Liu

(57) ABSTRACT

Method and system for testing circuitry of a programmable logic device (PLD). A host data processing arrangement is configured with a run-time reconfiguration programming interface, and a run-time reconfiguration test program that invokes methods of the interface executes on the host arrangement. In response to a method of the programming interface invoked from the test program, the PLD is configured with a first configuration bitstream. State data are then read back from the PLD in response to a method of the programming interface invoked from the test program. The test program also identifies differences between the state data and expected-results data.

24 Claims, 3 Drawing Sheets

RUN-TIME RECONFIGURABLE TESTING OF PROGRAMMABLE LOGIC DEVICES

GOVERNMENT CONTRACT

The U.S. Government has a paid-up license in this invention and the right in limited circumstances to require the patent owner to license others on reasonable terms as provided for by the terms of DABT63-99-3-0004 awarded by DARPA.

FIELD OF THE INVENTION

The present invention generally relates to testing circuitry of programmable logic devices (PLDs), and more particularly to testing PLDs in a run-time reconfigurable computing arrangement.

BACKGROUND

The methods and tools used to test programmable logic devices (PLDs) are currently very similar to those used in testing other types of integrated circuit devices. For example, standard commercially available test machines are used to test the PLDs. The PLDs are configured and then tested using test vectors. The test vectors are written to the device via device input pins and test results are extracted via device output pins. The output data are then compared to expected result data to verify correct operation of the configured PLD.

Some PLDs, for example field programmable gate array (FPGA) devices, have a wide variety of configurable resources, which makes testing time consuming. Given the variety of configurable resources, no single configuration is sufficient to exercise all the capabilities of the device. Thus, many reconfigurations of the PLD are performed, and new test vectors are used with each new configuration. Not only are current test methods time-consuming, but the limited bandwidth of the device constrains the ability to move test vectors into and retrieve results data from the device. Furthermore, once a fault or defect is detected, it may take many additional iterations to isolate the fault to a particular resource.

Built-in self test (BIST) approaches include storing the test vectors and results analysis logic in the PLD, which addresses PLD bandwidth issues. However, the BIST approach consumes PLD memory for storage of test vectors and results data at the expense of other potential uses. In addition, the location of the BIST circuitry must itself be defect-free, and special software is required to interface with the BIST circuitry.

The traditional and BIST approaches to testing PLDs each have different advantages but also have certain disadvantages. The traditional approach uses standard tools and methodologies and requires no changes to the PLD hardware, which reduces the learning required to construct a test for a device. The disadvantage is that the traditional approach is better suited to a production environment than an application environment. The BIST approach provides the flexibility of testing a PLD in an application environment. However, special test circuitry must be designed into the PLD, which may consume more than an inconsequential portion of device resources.

A system and method that address the aforementioned problems, as well as other related problems, are therefore desirable.

SUMMARY OF THE INVENTION

In various embodiments, the present invention tests the circuitry of a programmable logic device (PLD). A host data processing arrangement is configured with a run-time reconfiguration programming interface, and a run-time reconfiguration test program that invokes methods of the interface executes on the host arrangement. In response to a method of the programming interface invoked from the test program, the PLD is configured with a first configuration bitstream. State data are then read back from the PLD in response to a method of the programming interface invoked from the test program. The test program also identifies differences between the state data and expected-results data.

Various other embodiments are set forth in the Detailed Description and Claims which follow.

DETAILED DESCRIPTION

The various embodiments of the invention described below provide an environment for testing a programmable logic device (PLD) using a run-time reconfiguration test program. The test program generates a configuration bitstream, which is then used to configure the PLD. Under control of the test program, the PLD is activated and clocked in accordance with test-specific requirements. Result data are then read back from the PLD and compared to expected results under control of the test program. The testing environment allows further testing of the PLD by way of generating additional configuration bitstreams for testing other configurable resources of the PLD.

Figure 1:
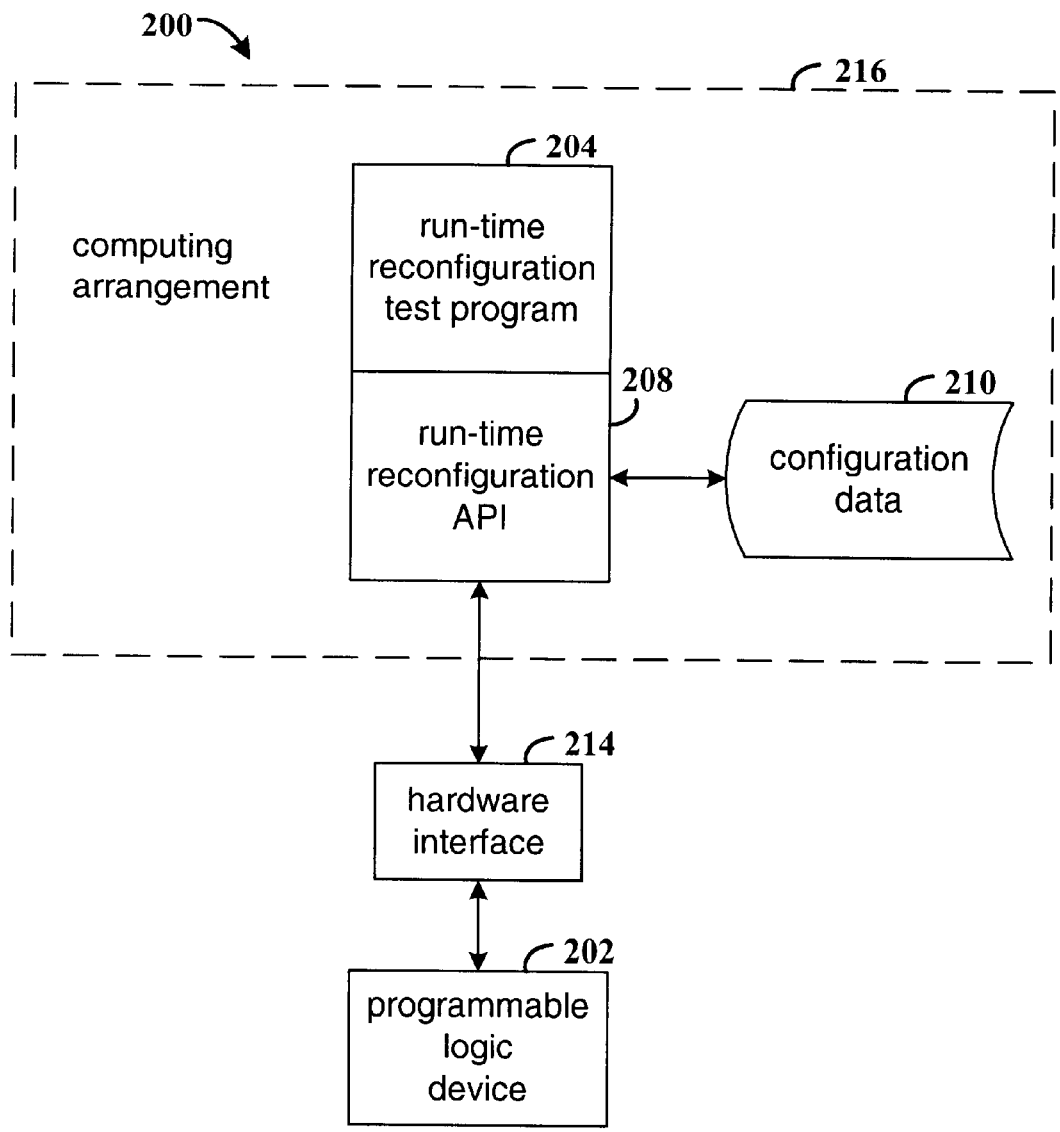
FIG. 1 is a block diagram of an example system for run-time reconfiguration of a PLD.

FIG. 1 is a block diagram of a system 200 for configuring a PLD 202 in a run-time reconfigurable (RTR) system. System 200 includes a run-time reconfiguration test program 204 that is written in the Java® language, for example. The test program 204 is written to control overall testing of PLD 202. Depending on the test requirements, the functions of test program 204 range from generating a configuration bitstream for testing various configurable resources of PLD 202 to determining whether the test produced the expected results.

Run-time reconfiguration application program interface (API) 208 allows test program 204 to manipulate configurable resources of PLD 202 via a set of functions that can be called from the test program. Test program 204 uses API 208 to establish configuration data 210 to be downloaded to PLD 202 and to download the configuration data to the PLD at a program-selected time. In one embodiment, the configuration data are an in-memory copy of the configuration data present in the PLD. In-memory refers to memory that is accessible to the test program, either directly or via a network connection. An example run-time reconfiguration API is provided in the JBits Software Development Kit from Xilinx.

API 208 also provides a core library that includes a collection of macrocell or "core" generators which are implemented as Java classes. The cores are generally parameterizable and relocatable within a device. Examples of cores include registers, counters, adders, multipliers, constant adders, constant multipliers, flip-flops and other standard logic and computation functions. The core generators can be used in constructing various tests for the device.

Configuration data 210 comprise a cached version of the current configuration state of PLD 202 together with any changes to the configuration made by test program 204. API 208 tracks which portions of PLD 202 need to be reconfigured relative to the state of configuration data 210, as described in the application/patent entitled, "Automatic Tracking and Assembly of Changed portions of Configuration Data for Partial Run-time Reconfiguration of a Programmable Logic Device," by Guccione et al., filed on Apr. 24, 2001, having application/patent number 09/841,270, and incorporated herein by reference. By tracking the changed portions of the configuration data, PLD 202 can be partially reconfigured, thereby greatly reducing the overhead of configuring the entire device.

Hardware interface 214 includes a portable layer of software and accompanying hardware to couple test program to programmable logic device 202. For example, hardware interface 214 may be the Xilinx Hardware Interface (XHWIF) which is available from Xilinx, Inc.

Computing arrangement 216 is coupled to programmable logic device 202 via hardware interface 214. The functional requirements of system 200 dictate the particular style and capabilities of processor 216. For example, some applications may call for a RISC based processor while others may call for a CISC. Various ones of special purpose or general purpose processors from manufacturers such as Intel, Sun Microsystems, Motorola, IBM, AMD and others may be suitable.

Figure 2:
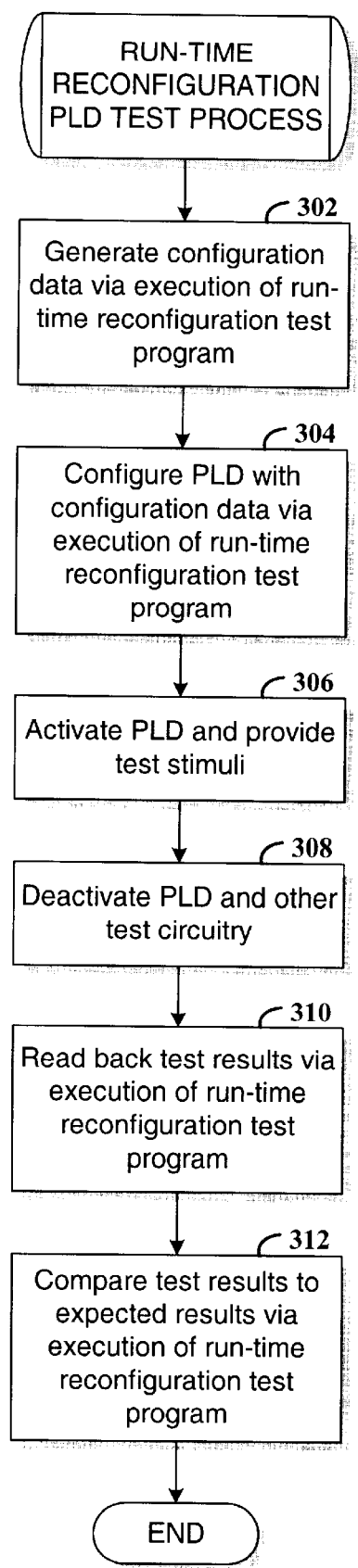
FIG. 2 is a flowchart of an example process for testing a PLD using a run-time reconfiguration test program.

FIG. 2 is a flowchart of an example process for testing a PLD using a run-time reconfiguration test program. Unlike current test techniques that rely on static configuration bitstreams and external stimulation to perform testing, the present invention supports dynamic modifications of PLD configurations for configuring, driving, and probing selected sections of the device under test. This reduces the bandwidth requirements for testing, both in the amount of configuration data necessary for the desired coverage and in the number of test input signals and vectors used to stimulate the device. Modification of the configuration bitstream by a run-time reconfiguration test program allows selected PLD resources to be reconfigured and faults to be quickly isolated.

The process begins with the generation of configuration data (step 302). In one embodiment the run-time reconfiguration test program 204 generates the configuration data via calls to the run-time reconfiguration API 208. In an alternative embodiment, the test program uses a pre-generated configuration bitstream. The configuration data programs selected resources of the PLD 202. For example, different configuration data are used for testing configuration memory cells of the PLD, programmable logic, wires PLD, and device timing.

The test program configures the PLD with the configuration data via the run-time reconfiguration API (step 304). Depending on test requirements, the configuration of the PLD may be full or partial, both of which are supported by the run-time reconfiguration API.

Test requirements dictate whether the PLD is activated (step 306) and the device clock is stepped, and whether test signals are input to the device. For example, testing configuration memory cells would not require stepping the device clock after all the cells are configured.

When the test is complete, the PLD is deactivated by stopping the device clock (step 308), and the test results are read back via the run-time reconfiguration API (step 310). Whether the test passed or failed is determined by comparing the test results to expected results data (step A logical first test to perform on a PLD, such as an FPGA, is a test of the configuration memory. If any of the configuration memory cells are defective, testing other parts of the device will be difficult or impossible. Additionally, if a memory cell is defective, an impermissible configuration could result and damage the device or other components connected to the device.

Using the run-time reconfiguration API 208, a test program 204 that tests configuration memory can be easily constructed and executed. For example, the code fragment below obtains previously established configuration data, downloads the configuration data to the PLD, reads back data ("read-back data") from the PLD, and performs a bit-wise comparison between the configuration data and the read-back data.

/* download previously defined bitstream to configuration memory */ device=Devices.XCV800;
board.setConfiguration(device, bs1);
/* read back configuration memory */
bs2=board.getConfiguration(device, bytes);
/* compare the data */
for (i=0; i<bs1.length; i++)
if (bs1[1]!=bs2[i])
System.out.println("Bitstream diff in byte " +i);

It will be appreciated that in a few lines of code a complete test of the configuration memory is performed. In another embodiment, the program includes code that generates the configuration data. For completeness the test should be repeated with several different configuration bitstreams to exercise the memory. For example, each configuration memory cell should be tested in storing logical zero and logical one values.

The code above also shows that the device type (XCV800) is hard-coded in the test program. In an alternative implementation, the device type is passed as a parameter to the test program, which allows the same test program to be used for different types of devices.

Once the configuration memory has been verified, other resources of the device can be tested, for example, the lookup tables of an FPGA. The code fragment below configures the F-lookup tables in slice 0 of a Virtex FPGA from Xilinx with logic zeros.

/* set LUT values to zeros */
jBits=new Jbits(Device.XCV800);
clbRows=jBits.getClbRows( );
clbCols=jBits.getClbColumns( );
for (row=0; row<clbRows; row++)
for (col=0; col<clbCols; col++)
jBits.set(row, col, LUT.SLICE0_F, 0);
/* download the configuration data */
bs1=jBits.getAllPackets( );
board.etConfiguration(device, bs1);
/* read back the configuration data */
bs2=board.getConfiguration(device, bytes);
jBits.setClbConfig(bs2);
/* compare original and read-back data */
for (row=0; row<clbRows; row++)
for (col=0; col<clbcols; col++)
if ((jBits.get(row, col, LUT.SLICE0$_{13}$ F) !=0);

writeDefect(row, col, LUT.SLICE_F);

It will be appreciated that to also test the slice-1 lookup tables, the example code can be supplemented with additional jBits.set( ) and jBits.get:( ) statements that reference the slice-1 lookup tables. In a further enhancement to the test, the code fragment is repeated to test stuck-at-zero defects by setting the lookup tables to logic ones instead of zeros. Faults can be quickly identified by comparison of read-back data from specific resources to the original data.

Another set of PLD resource to be tested is the set of wires in a device. Because modern PLDs, such as FPGAs, have a large number of interconnection resources, testing the resources is both a complex and large task. Generating a test that covers PLD wires is difficult using traditional design tools because of the limited control provided for explicitly controlling the routing. Thus, the generated configuration data are either stochastic or the wires are isolated using low-level design entry tools, which is time-consuming and error prone.

Even though low-level manipulation of PLD routing resources is required by use of the run-time reconfiguration API 208, the programming interface is simple. In addition, the high-level functions are also available for other manipulations of the configuration data. It will be appreciated that if the memory cells and lookup tables are previously tested, other resources of the device, such as wires, can be tested.

Figure 3:
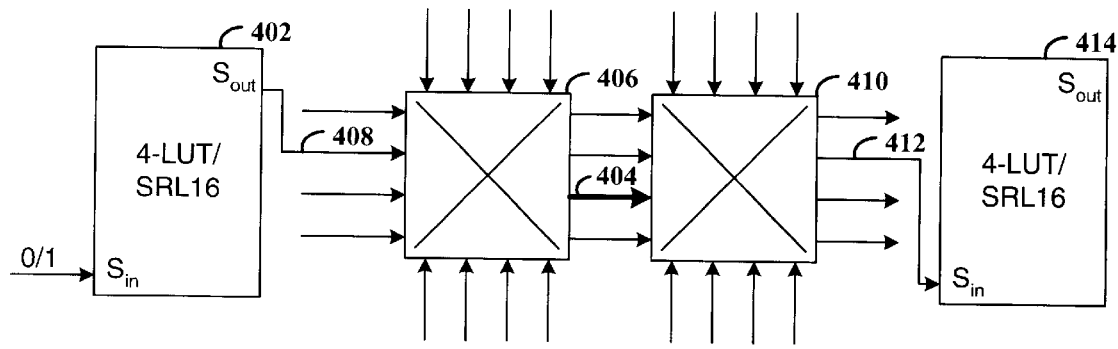
FIG. 3 is a functional block diagram of a circuit that tests a single wire of an field programmable gate array (FPGA).

FIG. 3 is a functional block diagram of a circuit that tests a single wire of an FPGA. Two 4-input lookup tables ("4-LUTs") are configured as sixteen-bit shift registers (SRL16). SRL16 402 supplies the input test data that drive the wire 404 under test. The input data pass through switch block 406, which drives the wire under test. Switch block 406 connects input wire 408 to wire 404. The data then pass through switch block 410, which connects wire 404 to output wire 412 and feeds the data into the input port of SRL16 414.

Typically, a single logic zero and a single logic one can be sent on the wire under test and shifted into SRL16 414. After the data have been transmitted on the wire and shifted into the shift register, the data are read from the output port of the shift register and compared to expected data. It will be appreciated that the number of bits shifted through SRL16 414 depends on test-specific requirements.

Switch blocks 406 and 410 are configurable to connect any one of 12 input wires to any one of 4 output wires. Note that switch blocks 406 and 410 are considered part of the wire under test in the example implementation. A different wire can be tested by changing the switch configuration in the configuration bitstream and reconfiguring the device under test. It will be appreciated that additional tests would be required to isolate a defect detected in the connection between SRL16 402 and SRL16 414.

In addition to tests that identify logic defects in a PLD, other characteristics, for example, device timing, can be tested using the run-time reconfiguration API 208.

Figure 4:
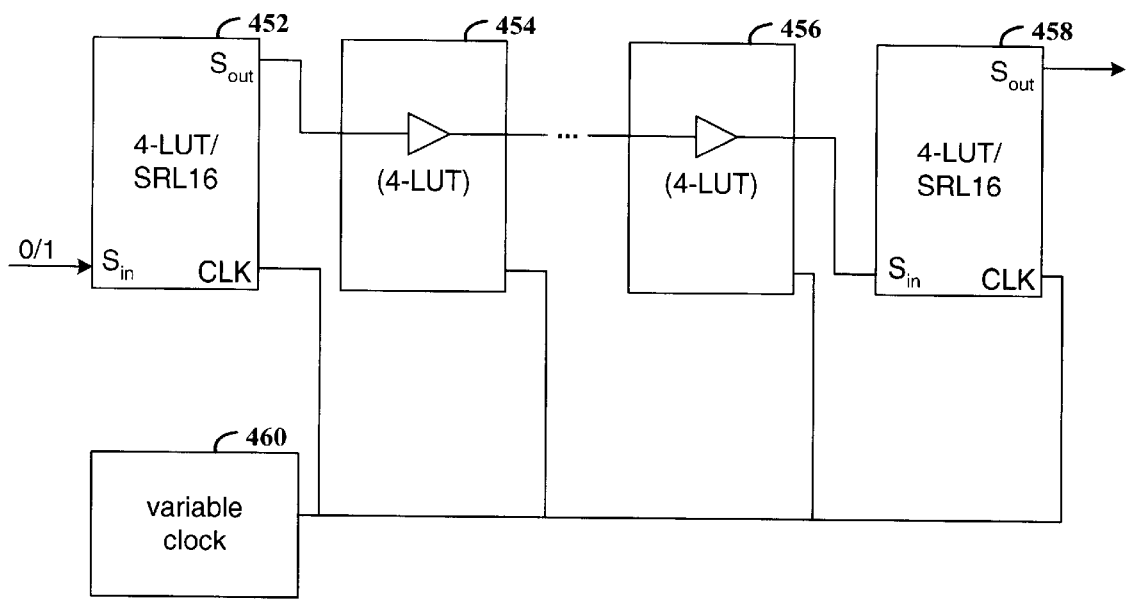
FIG. 4 is a block diagram of an FPGA-implemented circuit for testing timing characteristics of lookup tables in an FPGA.

FIG. 4 is a block diagram of an FPGA-implemented circuit for testing timing characteristics of lookup tables in an FPGA. A pattern of logic zeros and ones is sent through a chain of lookup table-implemented buffers and captured in a shift register. If the transmitted pattern matches the captured pattern under a tests at a selected clock speed, then the lookup tables are operable at the selected clock speed. It will be appreciated that the concepts presented for testing lookup tables can be adapted to testing other FPGA resources, such as flip-flops, wires, and input/output resources. In an example application, this test allows a designer to easily identify a maximum clock rate at which the PLD may be operated. Since specific devices may have slightly different delays due to manufacturing variability, the clock rate recommended by a conventional timing analysis tool may be less than that of which a specific chip is capable. Thus, the test may be used for device-specific characterization and grading.

A first 4-LUT 452 is configured as an SRL16. SRL16 452 shifts a pattern of logic zeros and ones and presents the output data to buffer 454, which is implemented with a 4-LUT. Buffer 454 is the first buffer in a chain (output-to-input port connections), and buffer 456 is the last buffer in the chain. It will be appreciated that the number of buffers in the chain depends on the type of device and test requirements. A second 4-LUT 458 is configured as an SRL16 for receiving the transmitted pattern. From SRL16 458, the data are stored for comparison to the pattern input to SRL16 452. Depending on the test requirements, the captured pattern may be stored either on or off the FPGA.

Variable clock 460 is configured on the FPGA to generate a clock signal to the SRL16s and chain of buffers for transmission of the pattern at a program-selected clock rate. To test the timing characteristics of the FPGA, a first pattern is sent across the chain a selected number of times at a first frequency and the captured data are compared to the transmitted pattern to determine whether the lookup tables are operable at the selected frequency. If the FPGA passes the test, the test is rerun at a higher frequency, and the testing continues until the captured pattern does not match the transmitted pattern. In another embodiment, an external clock generator is used to control the clock frequency. For example, the test program 204 calls hardware interface 214 which controls the clock frequency.

Various embodiments of the present invention are described with reference to FPGAs and tools, such as JBits, for developing run-time reconfiguration applications. Those skilled in the art will appreciate, however, that the invention could be implemented with other run-time reconfiguration tools and applied to programmable logic devices (PLDs) other than FPGAs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for testing circuitry of a programmable logic device (PLD) that is coupled to a host data processing arrangement, comprising:

executing on the host arrangement a run-time reconfiguration test program;

configuring the PLD with a first configuration bitstream in response to a method of the programming interface invoked from the test program;

reading back state data from the PLD in response to a method of the programming interface invoked from the test program; and identifying via the test program differences between the state data and expected-results data.

2. The method of claim 1, wherein the first configuration bitstream includes data for all configuration memory cells of the PLD and further comprising repeating the steps of configuring, reading, and identifying with a second configuration bitstream having different data from the first configuration bitstream.

3. The method of claim 1, further comprising generating the first configuration bitstream in response to methods of the programming interface invoked from the run-time reconfiguration test program.

4. The method of claim 3, further comprising generating configuration data in the first configuration bitstream for a plurality of like programmable resources of the PLD in response to an iteratively invoked method of the programming interface.

5. The method of claim 4, wherein the programmable logic device includes a plurality of configurable look-up tables, and the step of generating the first configuration bitstream includes generating configuration data for the look-up tables in response to methods of the programming interface invoked from the run-time reconfiguration test program.

6. The method of claim 5, further comprising repeating the steps of configuring, reading, and identifying with a second configuration bitstream having different data from the first configuration bitstream.

7. The method of claim 3, further comprising:
activating the PLD after configuration; and
providing a clock signal to the PLD and stepping the clock signal a selected number of cycles.

8. The method of claim 7, wherein the PLD includes a plurality of signal-routing resources, further comprising:
generating in the first configuration bitstream in response to methods of the programming interface invoked from the run-time reconfiguration test program, configuration data that implement a driver circuit that drives signals on selected ones of the signal-routing resources; and
generating in the first configuration bitstream in response to methods of the programming interface invoked from the run-time reconfiguration test program, configuration data that implement a receiver circuit that receives signals on the selected ones of the signal-routing resources and stores states of the signals.

9. The method of claim 8, wherein the driver circuit includes a shift register coupled to a demultiplexer.

10. The method of claim 9, wherein the receiver circuit includes a multiplexer having input ports coupled to output ports of the demultiplexer and having an output port coupled to a shift register.

11. The method of claim 7, further comprising:
generating in the first configuration bitstream in response to methods of the programming interface invoked from the run-time reconfiguration test program, configuration data that implement a driver circuit that drives a test signal in a selected pattern of signal states;
generating in the first configuration bitstream in response to methods of the programming interface invoked from the run-time reconfiguration test program, configuration data that implement a receiver circuit that receives the test signal and stores states of the signal; and
providing the clock signal to the PLD at a selected frequency in response to methods of the programming interface invoked from the run-time reconfiguration test program.

12. The method of claim 11, wherein the driver circuit includes a shift register, and the receiver circuit includes a shift register.

13. The method of claim 12, further comprising generating in the first configuration bitstream in response to methods of the programming interface invoked from the run-time reconfiguration test program, configuration data that implement a chain of buffers including a first buffer coupled to an output port of the driver circuit and a last buffer coupled to an input port of the receiver circuit.

14. An apparatus for testing circuitry of a programmable logic device (PLD) that is coupled to a host data processing arrangement, the host configured with a run-time reconfiguration programming interface, comprising:
means for executing a run-time reconfiguration test program;
means for configuring the PLD with a first configuration bitstream in response to a method of the programming interface invoked from the test program;
means for reading back state data from the PLD in response to a method of the programming interface invoked from the test program; and
means for identifying via the test program differences between the state data and expected-results data.

15. A system for testing circuitry of a programmable logic device (PLD), comprising:
a PLD interface device coupled to the PLD;
a host data processing arrangement coupled to the PLD interface device, the host arrangement configured with a run-time reconfiguration programming interface and a run-time reconfiguration test program, the test program adapted to configure the PLD with a first configuration bitstream by invocation of a method of the programming interface, read back a first set of state data from the PLD by invocation of a method of the programming interface, and identify differences between the first set of state data and a first set of expected-results data.

16. The system of claim 15, wherein the test program is further adapted to generate the first configuration bitstream by invocation of methods of the programming interface.

17. The system of claim 16, wherein the test program is further adapted to generate configuration data in the first configuration bitstream for a plurality of like programmable resources of the PLD by invocation of an iteratively invoked method of the programming interface.

18. The system of claim 17, wherein the programmable logic device includes a plurality of configurable look-up tables, and the test program is further adapted to generate configuration data for the look-up tables by invocation of methods of the programming interface.

19. The system of claim 18, wherein the test program is further adapted to configure the PLD with a second configuration bitstream, read back a second set of state data after configuration with the second configuration bitstream, and identify differences between the second set of state data and a second set of expected-results data.

20. The system of claim 16, wherein the test program is further adapted to activate the PLD after configuration, and provide a clock signal to the PLD and step the clock signal a selected number of cycles.

21. The system of claim 20, wherein the PLD includes a plurality of signal-routing resources, and the test program is further adapted to generate in the first configuration bitstream by invocation of methods of the programming interface, configuration data that implement a driver circuit that drives signals on selected ones of the signal-routing resource and configuration data that implement a receiver circuit that receives signals on the selected ones of the signal-routing resources and stores states of the signals.

22. A computer-implemented method for testing circuitry of a programmable logic device (PLD) that is coupled to a host data processing arrangement, the host configured with a run-time reconfiguration programming interface, comprising:

executing on the host arrangement a run-time reconfiguration test program;

loading an intended configuration bitstream into the PLD to produce an actual configuration bitstream;

reading back the actual configuration bitstream to produce a readback configuration bitstream; and identifying differences between the intended configuration bitstream and the readback configuration bitstream.

23. The computer-implemented method of claim 22 wherein if no differences are identified between the intended configuration bitstream and the readback configuration bitstream, a subsequent step is performed of testing wires in the PLD.

24. The computer-implemented method of claim 22 wherein if no differences are identified between the intended configuration bitstream and the readback configuration bitstream, a subsequent test is performed of loading a different intended configuration bitstream into the PLD and reading back a different readback configuration bitstream, whereby the intended bitstream and the different intended configuration bitstream apply both logic 0 and logic 1 to every configuration memory cell of the PLD.

* * * * *